(12) United States Patent
Matsushita (10) Patent No.: US 6,366,109 B1
(45) Date of Patent: Apr. 2, 2002

(54) SEMICONDUCTOR DEVICE TESTING SYSTEM AND METHOD

(75) Inventor: Shigeru Matsushita, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/348,489

(22) Filed: Jul. 7, 1999

(30) Foreign Application Priority Data

Jul. 7, 1998 (JP) .......................................... 10-192050

(51) Int. Cl.[7] .............................................. G01R 31/26
(52) U.S. Cl. ...................................................... 324/765
(58) Field of Search ............................. 324/765, 158.1, 324/763, 764, 758, 754

(56) References Cited

U.S. PATENT DOCUMENTS 5,323,108 A * 6/1994 Marker, III et al. ..... 324/158.1

* cited by examiner

Primary Examiner—Safet Metjahic
Assistant Examiner—James C Kerveros

(74) Attorney, Agent, or Firm—Rosenthal & Osha L.L.P.

(57) ABSTRACT

A semiconductor device testing system for testing a semiconductor device with a plurality of pins by applying a test signal includes a tester controller, a logical pin number of a logical pin, pin assignment data, a pin assignment convertor, and a test unit. The tester controller outputs generation data used for generating the test signal. The test signal is applied to the logical pin number of of the logical pin according to the generation data. The pin assignment data denoting a relationship between the logical pin number and a physical pin number of a physical pin to which the test signal is applied according to the semiconductor device. The pin assignment convertor converts the logical pin number into the physical pin number based on the pin assignment data. The test unit uses the generation data to prepare the test signal for application to the physical pin designated by the physical pin number. The test unit preferably includes a pattern generator that generates the test signal based upon the generation data. The tester controller notifies the pin assignment convertor of the logical pin number. The tester controller notifies the pin assignment convertor of the logical pin number. The pin assignment convertor includes a pin map memory that stores the pin assignment data.

13 Claims, 5 Drawing Sheets

| LOGICAL PIN NUMBER | PHYSICAL PIN NUMBER |
|---|---|
| 1 | 2 |
| 2 | 5 |
| 3 | 6 |
| ... | ... |
| 49 | 49 |
| 50 ~94 | 41 ~96 |

PIN ASSIGNMENT DATA

SEMICONDUCTOR DEVICE TESTING SYSTEM AND METHOD

This patent application claims priority based on a Japanese patent application, H10-192050 filed on Jul. 7, 1998, the contents of which are incorporated herein by reference.

BACKGROUND OF THE INVENTION

1. Field of the Invention

This invention relates to a system for testing semiconductor devices, and in particular to a semiconductor device testing system including a pin assignment convertor converting logical pin numbers and physical pin numbers of a test unit.

2. Description of the Related Art

Figure 1:
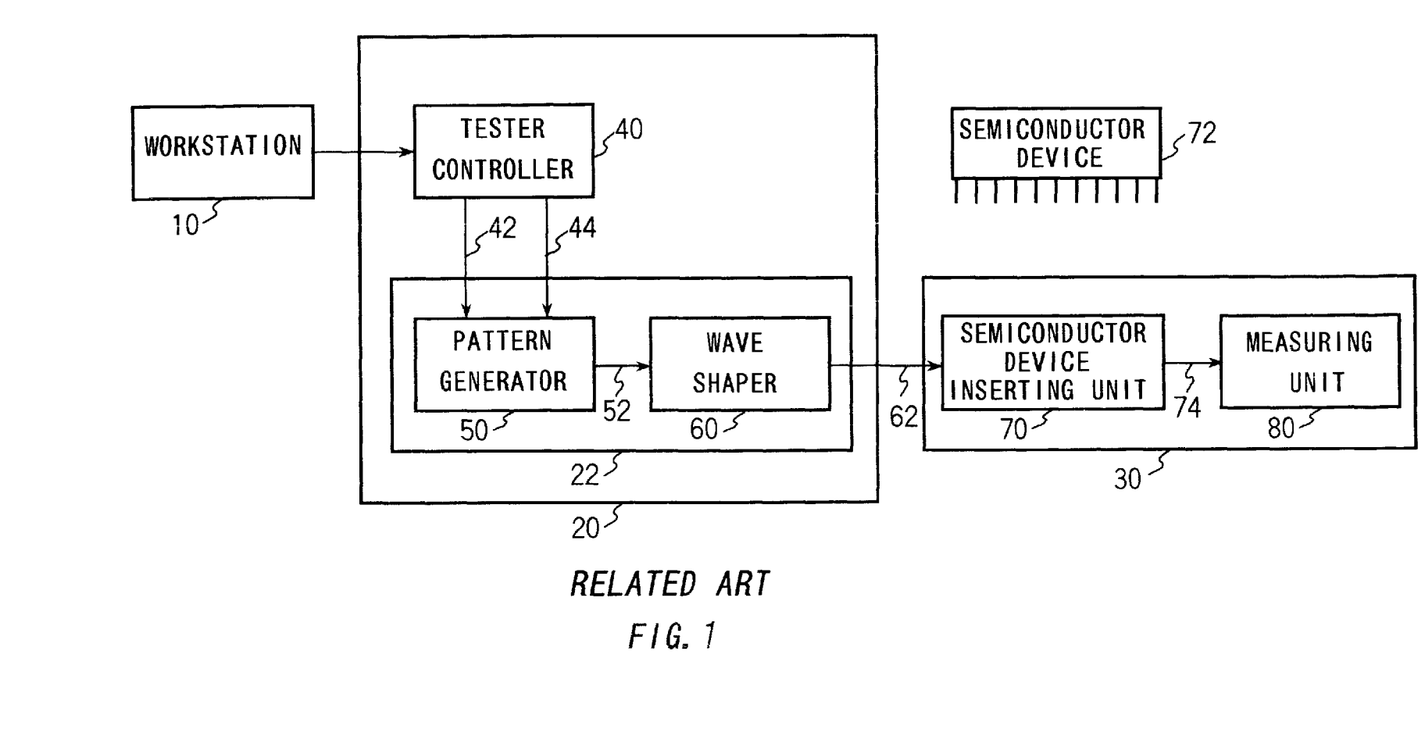
FIG. 1 shows a conventional semiconductor device testing system.

FIG. 1 shows a conventional semiconductor device testing system inspecting a semiconductor device 72. The semiconductor device testing system incorporates a workstation 10, a tester body 20, and a test head 30, wherein the workstation 10 is connected to the tester body 20, which is also connected to the test head 30 using a cable.

The tester body 20 includes a tester controller 40 and a test unit 22, which has a pattern generator 50 and a wave shaper 60. The test head 30 includes a measuring unit 80 and a semiconductor device insertion unit 70 on which the semiconductor device 72 lies.

The workstation 10 readies a test vector and test program used for inspecting the semiconductor device 72 using logical pin numbers, which are virtual pin numbers of the test unit 22 assigned in software. In addition to the test vector and the test program, a pin correspondence table is defined that is used for converting the logical pin numbers into the physical pin numbers assigned to the hardware of the test unit 22. In the pin correspondence table, logical pin numbers correspond to respective physical pin numbers.

The test vector, the test program, and the pin correspondence table are compiled together. This compile converts logical pin numbers into physical pin numbers pursuant to the pin correspondence table. The compiled files are fed into the tester controller 40. The tester controller 40, which includes a dedicated processor managing or controlling hardware and software in the test system, prepares a data signal 44 and an address signal 42 to feed them into the pattern generator 50. The address signal 42 designates the pins of the test unit 22 in terms of physical pin numbers.

The pattern generator 50 outputs the semiconductor device input signal 52 to the wave shaper 60 based upon the address signal 42 and the data signal 44. When the wave shaper 60 receives the semiconductor device input signal 52, it shapes the signal according to the characteristic of the semiconductor device 72. After shaping, the wave shaper 60 feeds the semiconductor device input signal 62 to the semiconductor device insertion unit 70.

Within the semiconductor device insertion unit 70, the semiconductor device 72 receives the semiconductor device input signal 62 to feed an output signal 74 according thereto to the measuring unit 80. The measuring unit 80 judges whether the semiconductor device 72 meets given criterion.

Generally, semiconductor chips are packed into a variety of packages each having a different wiring, in general. In other words, for example, even though two different packages each include the same semiconductor chip, the pin assignment of the first package will differ from that of the second. From viewpoint of function, a pin number for a given function in the former package is also different from a pin number for the same given function in the latter package.

As described above, the test vector and the test program are prepared pursuant to the virtual logical pin numbers. Meanwhile, the actual physical pin numbers depends upon semiconductor devices. Therefore, in order to inspect the semiconductor devices, the logical pin numbers are required to converted into the corresponding physical pin numbers in the test unit 22 for each semiconductor device.

As described above, the pin correspondence table, which denotes relationship between the logical pin numbers and the physical pin numbers, are compiled with the test vector and the test program. Here, the pin correspondence table is required to be prepared for each semiconductor device. As a result, the compile of the test vector and program, and the pin correspondence table needs to be executed for each semiconductor device.

Accordingly, in the conventional semiconductor device testing system, the workstation 10 manages compiled files for each kind of semiconductor device. Further, a request for improving a part of the test vector or the test program arises, not all of the compiled files prepared for a variety of semiconductor devices are not available for improvement because it is difficult to correct compiled test vectors or test programs. Rather, it is necessary to prepare a new test vector or program to recompile it with the pin correspondence table. The revised test vector or program is recompiled for each pin correspondence table, that is to say, for each semiconductor device, which requires far too much time.

Such increased processes also increased the risk of operator error. For example, the risk of compilation errors or of failure when managing compiled files is increased.

SUMMARY OF THE INVENTION

Therefore, it is an object of the present invention to provide a semiconductor device testing system and method which overcomes the above issues in the related art. This object is achieved by combinations described in the independent claims. The dependent claims define further advantageous and exemplary combinations of the present invention.

According to an aspect of the present invention, there is provided a semiconductor device testing system for testing a semiconductor device with a plurality of pins by applying a test signal, comprising: a tester controller that outputs generation data used for generating the test signal, a logical pin number of a logical pin to which the test signal is applied according to the generation data, and pin assignment data denoting a relationship between the logical pin number and a physical pin number of a physical pin to which the test signal is applied according to the semiconductor device; a pin assignment convertor that converts the logical pin number into the physical pin number based on the pin assignment data; and a test unit that uses the generation data to prepare the test signal for application to the physical pin designated by the physical pin number.

The test unit preferably includes a pattern generator that generates the test signal based upon the generation data.

The tester controller preferably notifies the pin assignment convertor of the logical pin number. The tester controller preferably replaces the pin assignment data with another pin assignment data. The tester controller preferably outputs to the pin assignment convertor a recognition bit used for determining whether or not the logical pin number and the physical pin number are converted.

The pin assignment convertor preferably includes a pin map memory that stores the pin assignment data. The pin map memory preferably includes a plurality of address pins notified of the logical pin number, and a plurality of data pins notifies of the physical pin number. The pin assignment convertor preferably determines whether or not the logical pin number and the physical pin number are converted, based upon the value of the recognition bit. The pin assignment convertor preferably includes a recognition decoder that receives the recognition bit from the tester controller, and the recognition decoder determines whether or not the logical pin number and the physical pin number are converted.

The semiconductor device testing system preferably further comprises a workstation including a monitor that displays the logical pin number.

According to another aspect of the present invention, there is provided a method of testing a semiconductor device using a test unit that prepares a test signal and has a plurality of logical pin numbers and a plurality of physical pin numbers, comprising: outputting the plurality of logical pin numbers and a generation data used for generating the semiconductor input signal; converting the plurality of logical pin numbers into the plurality of physical pin numbers; generating the test signal based upon the generation data; feeding the test signal to the semiconductor device pursuant to the plurality of physical pin numbers; and measuring a signal output from the semiconductor device in response to the test signal.

The method preferably comprises sending a pin assignment data used for assigning the plurality of logical pin numbers, to a pin assignment convertor that converts the plurality of logical pin numbers and the plurality of physical pin numbers, wherein the conversion is based upon the pin assignment data.

According to further another aspect of the present invention, there is provided a pin number converting apparatus that converts a plurality of logical pin numbers into a plurality of physical pin numbers, the plurality of physical pin numbers being assigned to respective of the plurality of logical pin numbers, comprising: a controller that outputs a recognition bit used for recognizing whether or not the plurality of logical pin numbers and the plurality of physical pin numbers are converted; and a pin assignment convertor that converts the plurality of logical pin numbers and the plurality of physical pin numbers based upon the recognition bit.

The pin assignment convertor preferably includes a pin map memory that stores a pin assignment data used for assigning the plurality of logical pin numbers to the plurality of physical pin numbers.

According to still another aspect of the present invention, there is provided a semiconductor device testing system that tests a semiconductor device including a semiconductor chip and a semiconductor package having a plurality of pins by applying a test signal thereto, comprising: a preparing circuit that prepares a data used for generating the test signal, and a logical pin number of a logical pin to which the test signal is applied according to the data; a generating circuit that generates the test signal based upon the data; a storing circuit that stores a table denoting a relationship between the logical pin number and a physical pin number to which the test signal is applied; a converting circuit that converts the logical pin number into the physical pin number pursuant to the table; and an applying circuit that applies the test signal to a pin designated by the physical pin number.

The data differs among different semiconductor chips. The logical pin number differs among different semiconductor chips. The physical pin number differs among different semiconductor packages. The preparing circuit prepares a recognition signal denoting whether or not the logical pin number is converted into the physical pin number, wherein the converting circuit converts pursuant to the recognition signal.

This summary of the invention does not necessarily describe all necessary features so that the invention may also be a sub-combination of these described features.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Hereinafter, the preferred embodiment of the semiconductor device testing system will now be described.

Figure 2:
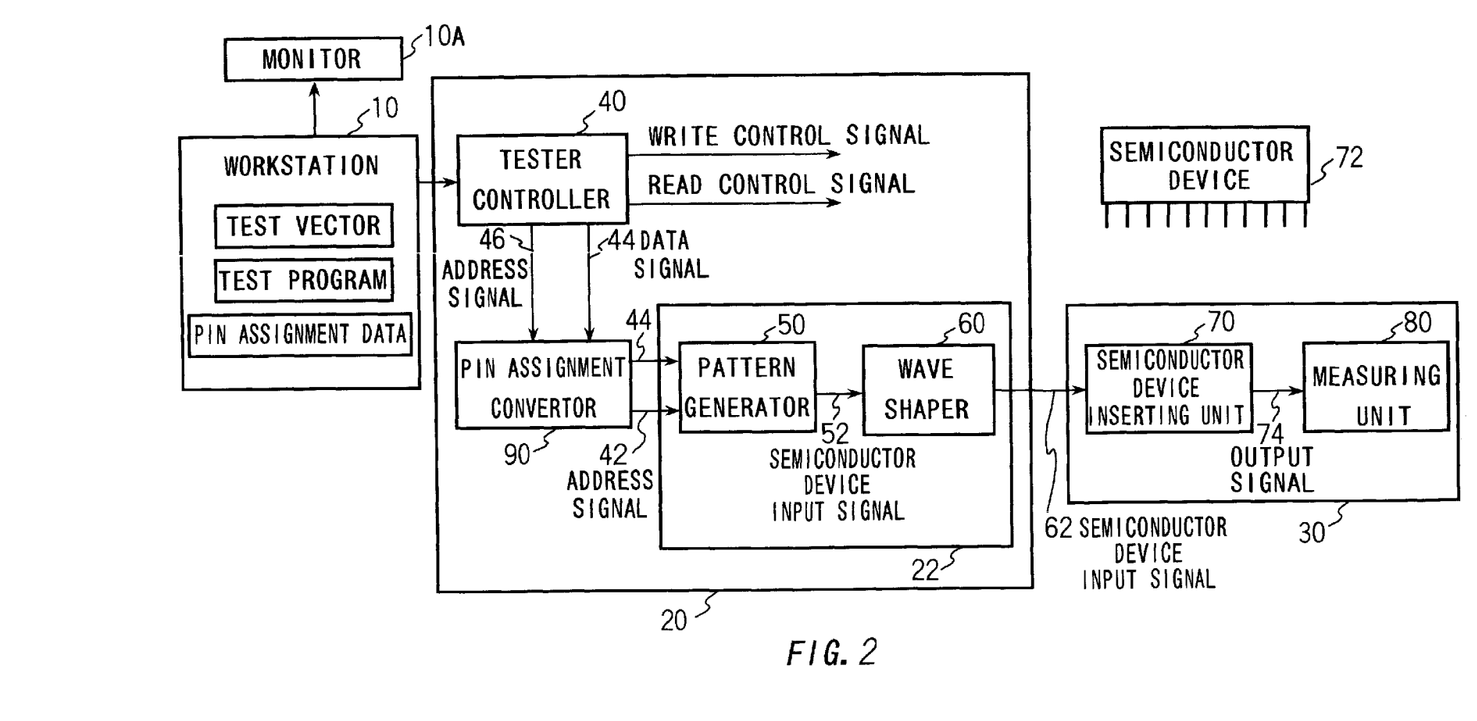
FIG. 2 illustrates a preferred embodiment of the semiconductor device testing system according to the present invention.

FIG. 2 shows a preferred embodiment of a semiconductor device testing system according to the present invention. The semiconductor device testing system is used for a semiconductor device 72. To test the semiconductor device 72, the semiconductor device testing system incorporates a workstation 10, a tester body 20, and a test head 30. The workstation is operated by an operator while the test head 30 accommodates the semiconductor device 72, wherein the workstation 10 is connected to the tester body 20, and the tester body 20 is further connected to the test head 30 via a cable or the like.

The tester body 20 includes a tester controller 40, a pin assignment convertor 90, and a test unit 22. The test unit 22 includes a pattern generator 50 and a wave shaper 60 to prepare and process a semiconductor device input signal 62 being fed into the semiconductor device 72. Logical pin numbers are allotted in terms of software used for generating test signals while physical pin numbers allotted in terms of hardware of the semiconductor packages. For example, assuming that the same semiconductor chip is packed in different semiconductor packages A and B respectively, the test signals and the logical pin numbers for testing the chip in the package A and those for testing the chip in the package B are the same. However, since the arrangement of the pins of the package A and that of the package B are different, the logical pin numbers for the package A and those for the package B are different from each other.

The test head 30 includes a semiconductor device insertion unit 70 and a measuring unit 80. In FIG. 2, the measuring unit 80 is shown positioned in the test head 30, but the measuring unit 80 may also be positioned in the tester body 20.

The workstation 10 prepares a test vector and test program used for testing the semiconductor device 72, using logical pin numbers of the test unit 22. That is to say, the test vector and test program are oriented to the logical pin numbers. Here, the test vector has an input pattern and an expected pattern; meanwhile, the test program shows setting of necessary hardware and software process for evaluating the semiconductor device 72, which is described using a machine language peculiar to the semiconductor device testing system. The workstation 10 or the operator also prepares a pin assignment data used for converting the above logical pin numbers into physical pin numbers.

After they are prepared by the workstation 10, the test vector, the test program, and the pin assignment data are fed into the tester controller 40. Unlike the related art, the test vector and test program are not compiled with the pin assignment data. Therefore, the test program designates the pins of the test unit 22 in terms of logical pin numbers. As described above, in FIG. 1 of the related art, the logical pin numbers are converted into the physical pin numbers by the workstation 10, and the tester controller 40 outputs the address signal 42 designating the addresses of the physical pins of the test unit 22.

In contrast, in this example of the preferred embodiment, the tester controller 40 prepares a data signal 44 and an address signal 46, wherein the data signal 44 is used for preparing the semiconductor device input signal 62 while the address signal 46 is used for designating the logical pins of the test unit 22. In addition to the address signal 46 and the data signal 44, the tester controller 40 prepares a write control signal and a read control signal. The tester controller 40 outputs to the pin assignment converters 90 the address signal 46 and the data signal 44 with those signal corresponding to each other.

The pin assignment convertor 90 performs conversion of the logical pin numbers into the physical pin numbers pursuant to the pin assignment data. Detail of pin assignment data will be described later with reference to FIG. 3. The data signal 44 and the address signal 42 indicating the physical pin numbers converted from the logical pin numbers are fed into the pattern generator 50. The pattern generator 50 prepares the semiconductor device input signal 52 used for testing the semiconductor device 72. For example, the semiconductor device input signal 52 includes a test data signal, a control signal, and an address signal.

The semiconductor device input signal 52 is provided to the wave shaper 60 to be shaped therein according to the characteristic of the semiconductor device 72, and to thus become a semiconductor device input signal 62. Thereafter, the semiconductor device input signal 62 is output into the semiconductor device insertion unit 70 via the cable or the like. In the test head 30, the semiconductor device 72 has been set in the semiconductor device insertion unit 70 in advance, wherein the semiconductor device 72 receives the semiconductor device input signal 62. The semiconductor device 72 feeds an output signal 74 to the measuring unit 80 in response to the semiconductor device input signal 62. The measuring unit 80 judges whether the semiconductor device 72 satisfies the given criterion, thereby checking the device.

The workstation 10 comprises a monitor 10A. The monitor 10A receives from the workstation 10 information such as the test vector, the test program, the pin assignment data, and the result of judgment by the measuring unit 80 as required for a desired display. In addition, the monitor 10A indicates the logical pin numbers. Thus, the operator can test the semiconductor device 72 by noting just the logical pin numbers.

Figure 3:
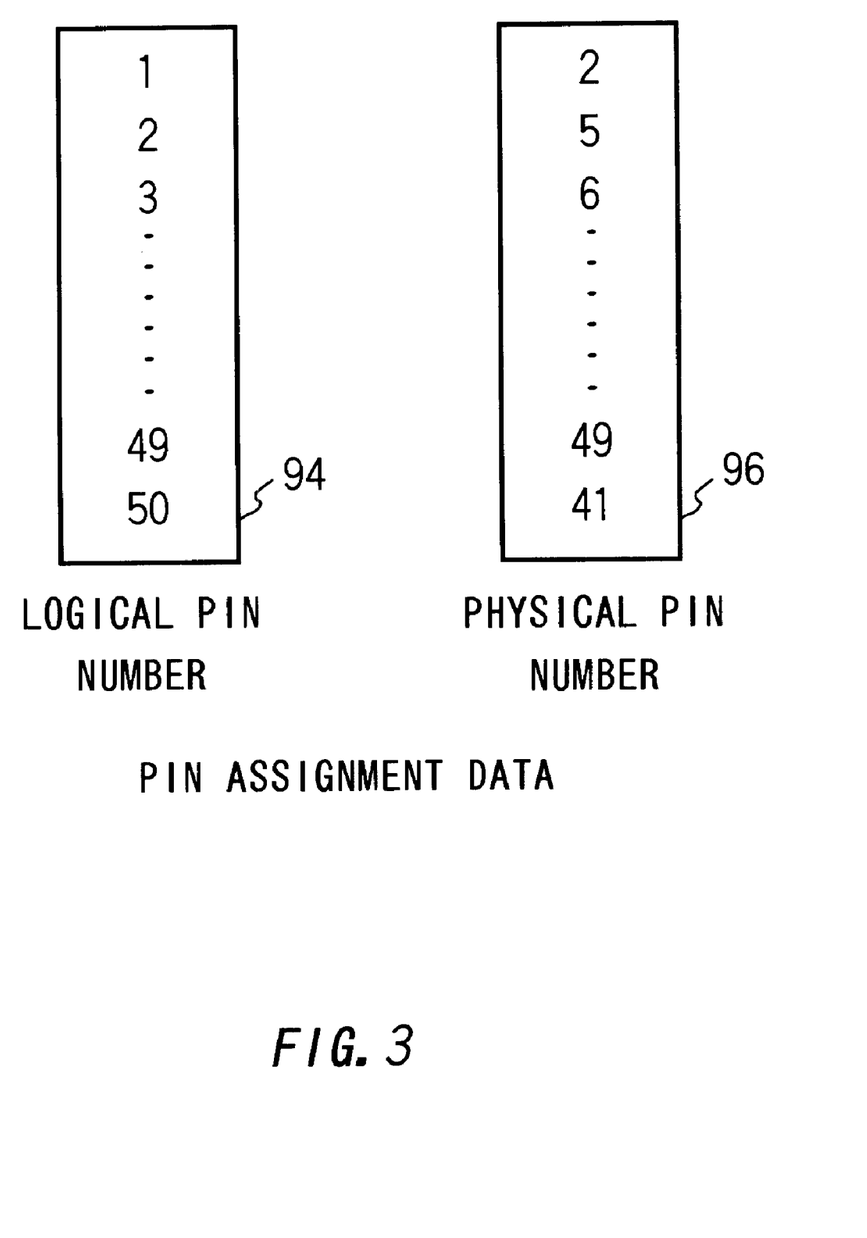
FIG. 3 shows pin assignment data used for assigning logical pin numbers to physical pin numbers.

FIG. 3 shows the pin assignment data used to assign the logical pin numbers to the physical pin numbers. As described above, semiconductor chips can generally be packed in a variety of packages and pin assignment data must be prepared for each package. In FIG. 3, the data string 94 denotes the logical pin numbers while the data string 96 denotes the physical pin numbers corresponding to respective logical pin numbers. The data string 96 depends upon the package. In other words, the logical pin numbers are fixed while the physical pin numbers differ for each package.

Figure 4:
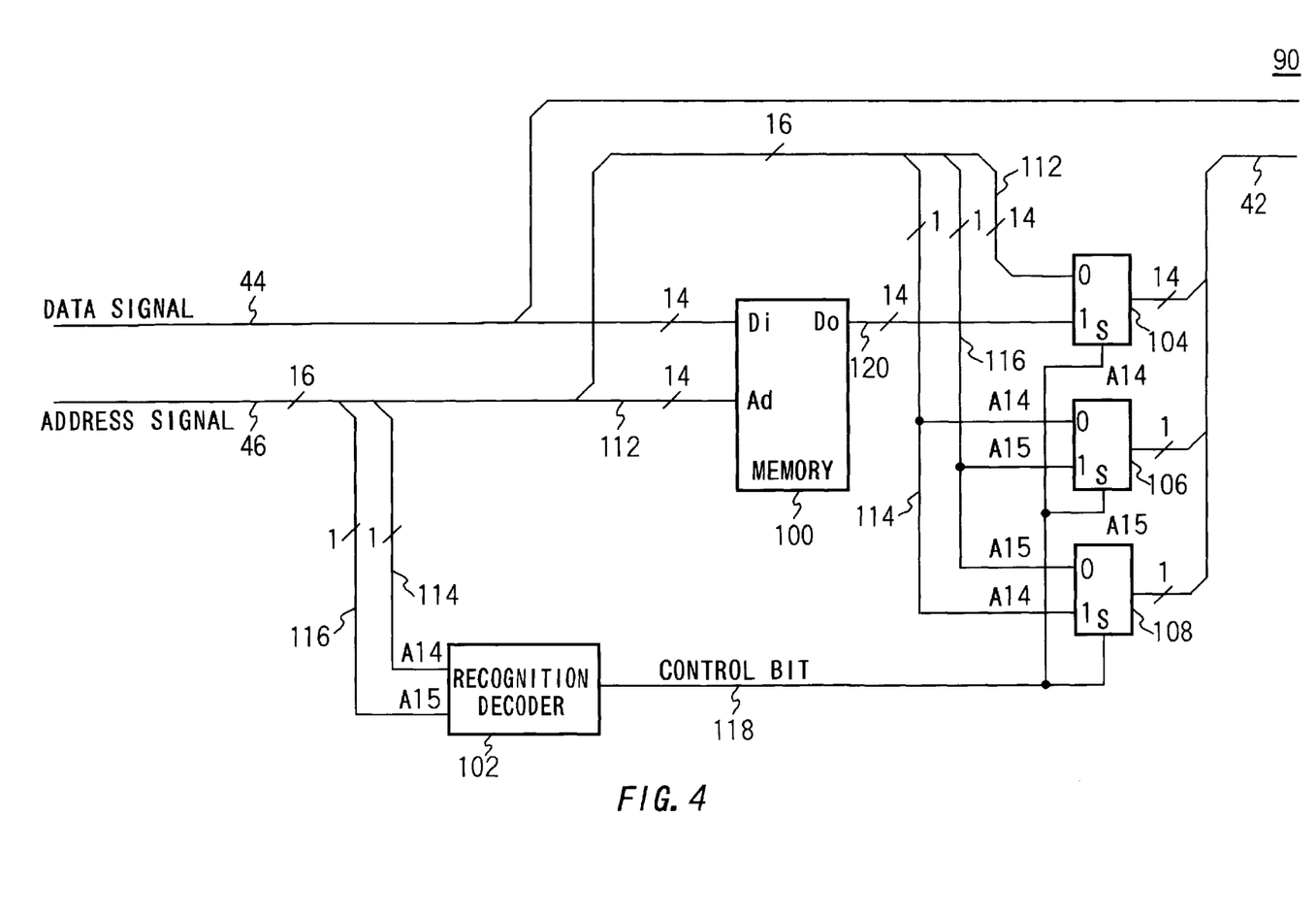
FIG. 4 shows a configuration of a pin assignment convertor.

FIG. 4 shows the configuration of the pin assignment convertor 90 of this example of the preferred embodiment of the present invention. The pin assignment convertor 90 incorporates a pin map memory 100, a recognition decoder 102, and multiplexers 104, 106, 108. The multiplexer 104 show here includes only one multiplexer element to ease explanation, but such a multiplexer may actually include a plurality of multiplexer elements. The pin assignment convertor 90 receives from the tester controller 40 the address signal 46 and the data signal 44. Each physical pin number specified by the data string 96 is stored in the address of the pin map memory 100 specified by the data string 94. In other words, each physical pin number specified by the data signal 44 is stored in the address of the pin map memory 100 specified by the address signal 46.

The address signal 46 includes a pin designating bit 112, and recognition bits 114 and 116. The pin designating bit 112 designates information related to the pin numbers of the test unit 22. The recognition bits 114 and 116 denote whether the pin designating bit 112 indicates the logical pin numbers, the physical pin numbers, or the other information. If the pin designating bit 112 denotes the logical pin numbers, the recognition decoder 102 activates the control bit 118, which is fed into all the multiplexers 104, 106, and 108. Simultaneously, the pin map memory 100 outputs to the multiplexer 104, the output data 120 designated by the pin designating bit 112.

The pin designating bit 112 is fed into the 0-terminal of the multiplexer 104 while the output data 120 of the pin map memory 100 is fed into the 1-terminal of the multiplexer 104. The recognition bit 114 is provided to the 0-terminal of the multiplexer 106 and the 1-terminal of the multiplexer 108 while the recognition bit 116 is provided to the 1-terminal of the multiplexer 106 and the 0-terminal of the multiplexer 108.

When the control bit 118 connected to the multiplexers 104, 106, and 108 is activated, it selects the 1-terminals thereof. More specifically, the multiplexer 104 feeds the output data 120, the multiplexer 106 feeds the recognition bit 116, and the multiplexer 108 feeds the recognition bit 114. Consequently, in the address signal 46, the pin designating bit 112 is replaced with the output data 120 while the recognition bit 114 and the recognition bit 116 are switched.

On the other hand, when the control bit 118 is inactivated, for example, the pin designating bit 112 denotes the physical pin numbers, the 0-terminals of the multiplexers 104, 106, and 108 are respectively selected with their addresses unchanged.

To inspect different semiconductor devices wherein the same semiconductor chips are packed in different packages using the same tester vector and the test program, the pin assignment data stored in the pin map memory 100 must be replaced with different pin assignment data. Therefor, the tester controller 40 provides the control pins (not shown) of the pin map memory 100 with the write control signal, thus outputting the logical pin numbers to the address terminals of the pin map memory 100 and the physical pin numbers to the data input terminals thereof, based upon the new pin assignment data. Specifically, the logical pin numbers are provided to the address terminals by the address signal 46 while the physical pin numbers are provided to the data terminals by the data signal 44.

The above description focuses on conversion of the logical pin numbers into the physical pin numbers. To allow the semiconductor device testing system of the present invention to be widely utilized, the pin assignment convertor 90 preferably outputs the logical pin numbers using the physical pin numbers as the addresses in addition to outputting the physical pin addresses using the logical pin numbers.

Figure 5:
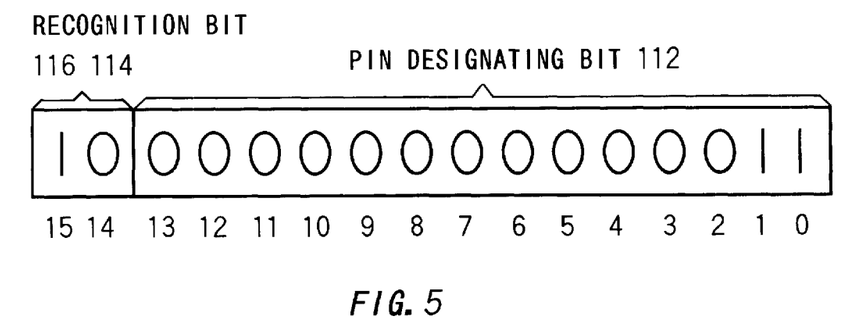
FIG. 5 illustrates an address signal 46.

FIG. 5 illustrates the address signal 46. The address signal 46 has a width of 16 bits, which includes pin designating bits 112 having 14 bits (bit 0–13) and recognition bits 114 and 116 having 2 bits (bit 14–15). Hereinafter, a example will be explained that the pin assignment converter 90 converts the logical pin numbers "3" in FIG. 3 into the physical pin number "6" therein.

The recognition bits 114 and 116 determines whether the pin designating bit 112 is indicative of the logical pin numbers, the physical pin numbers, or other information. In the example, the recognition bit "10" shows that the pin designating bit 112 represents the logical pin numbers.

The pin designating bit 112 "00000000000011" specifies the pin numbers of the semiconductor device 72. Because the recognition bit "10" shows that the pin designating bit 112 indicates the logical pin numbers, the pin designating bit 112 "00000000000011" shows that the logical pin numbers are "3".

The recognition decoder 102 decodes the recognition bit 114 (bit 14) and the recognition bit 116 (bit 15), thereby recognizing that the pin designating bit 112 (bit 0–13) of the address signal 46 is indicative of the logical pin numbers. Thereafter, the control bit 118, which are connected to the multiplexers 104, 106, and 108, are activated. The pin map memory 100 outputs to the multiplexer 104 the output data 120 that the logical pin number "3" is converted into the physical pin number "6".

As described above, the 1-terminals of the multiplexers 104, 106, and 108 are selected on the basis of the control bit 118. Consequently, the multiplexer 104 outputs the output data 120, the multiplexer 106 outputs the value "1", and the multiplexer 108 outputs the value "0". Accordingly, the recognition bit "01" which has experienced inverting is output.

Figure 6:
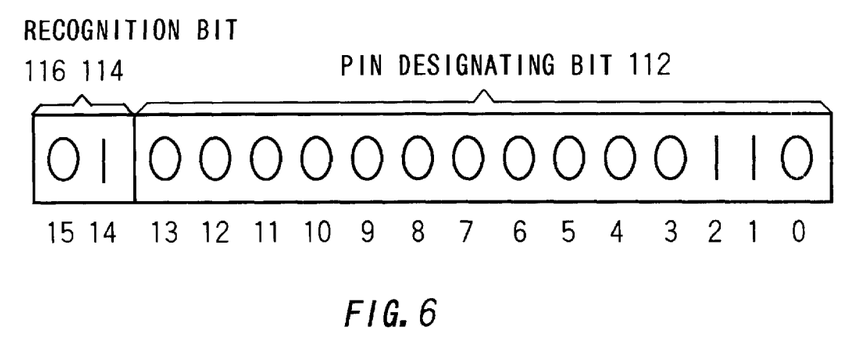
FIG. 6 shows an address signal 42.

FIG. 6 shows the address signal 42 wherein the logical pin numbers are converted into the physical pin numbers. The recognition bit 112 is inverted to be "01" and the pin designating bit 112 turns into "00000000000110". Since the recognition bit "01" shows that the pin designating bit 112 is indicative of the physical pin numbers, the pin designating bit 112 "00000000000110" shows that the physical pin number is "6".

As shown in FIG. 1, the address signal 42 is fed into the test unit 22. In the test unit 22, the tester controller 40 outputs a unit selecting signal, which indicates which of units the address signal 42 is provided to. The address signal 42 is input into the address pins of a unit specified by the unit signal.

As described above, in accordance with the present invention, the semiconductor device testing system is capable of reducing the number of the files being managed by the operator thereof. Further, the test system can simplify the process that the operator should perform in inspecting the semiconductor devices, which reduces the cost for testing the semiconductor devices. Moreover, since the logical pin numbers are displayed, the operator can test semiconductor devices noting only the logical pin numbers.

Although the present invention has been described by way of exemplary embodiments, it should be understood that many changes and substitutions may be made by those skilled in the art without departing from the spirit and the scope of the present invention which is defined only by the appended claims.

What is claimed is:

1. A semiconductor device testing system for testing a semiconductor device with a plurality of pins by applying a test signal, comprising:

a tester controller to output generation data for generating said test signal, a pin designating bit which designates a logical pin number of a pin to which said test signal is applied, and pin assignment data denoting a relationship between said logical pin number and a physical pin number of said semiconductor device to which said test signal is applied;

a pin assignment converter to receive said logical pin number and to convert said logical pin number into said physical pin number based on said pin assignment data; and a test unit to prepare said test signal according to said generation data for application to a physical pin designated by said physical pin number, wherein said pin assignment converter includes:

a pin map memory which stores said pin assignment data, having address terminals for inputting said pin designating bit, and data terminals for outputting output data; and a multiplexer which receives said output data from said pin map memory and said pin designated bit from said tester controller, and outputs either said output data or said pin designating bit as said physical pin number;

wherein said tester controller outputs to said pin assignment converter a recognition bit used for determining whether or not said logical pin number and said physical pin number are converted.

2. A semiconductor device testing system as set forth in claim 1, wherein said pin assignment converter determines whether or not said logical pin number and said physical pin number are converted, based upon the value of said recognition bit.

3. A semiconductor device testing system as set forth in claim 2, wherein said pin assignment converter includes a recognition decoder that receives said recognition bit from said tester controller and outputs a control bit by decoding said recognition bit, and said multiplexer outputs either said output data or said pin designating bit as said physical pin number according to said control bit.

4. A semiconductor device testing system as set forth in claim 2, wherein said test unit includes a pattern generator that generates said test signal based upon said generation data.

5. A semiconductor device testing system as set forth in claim 2, wherein said tester controller replaces said pin assignment data with another pin assignment data.

6. A semiconductor device testing system as set forth in claim 2, further comprising a workstation including a monitor, wherein said monitor displays said logical pin number.

7. A semiconductor device testing system as set forth in claim 2, wherein
said multiplexer outputs either said output data or said pin designating bit as said physical pin number according to said recognition bit.

8. A method of testing a semiconductor device using a semiconductor device testing system for testing a semiconductor device with a plurality of pins by applying a test signal, comprising:
a tester controller to output generation data for generating said test signal a pin designating bit which designates a logical pin number of a pin to which said test signal is applied, and pin assignment data denoting a relationship between said logical pin, number and a physical pin number of said semiconductor device to which said test signal is applied;
a pin assignment converter to receive said logical pin number and to convert said logical pin number into said physical pin number based on said pin assignment data; and
a test unit to prepare said test signal according to said generation data for application to a physical pin designated by said physical pin number,
wherein said pin assignment converter includes:
a pin map memory which stores said pin assignment data, having address terminals for inputting said pin designating bit, and data terminals for outputting output data; and
a multiplexer which receives said output data from said pin map memory and said pin designated bit from said tester controller, and outputs either said output data or said pin designating bit as said physical pin number;
wherein said tester controller notifies said pin assignment convertor of said logical pin number;
wherein said tester controller outputs to said pin assignment converter a recognition bit used for determining whether or not said logical pin number and said physical pin number are converted;
the method comprising:
outputting from a tester controller a pin designating bit, which designates said plurality of logical pin numbers, and generation data for generating said semiconductor input signal;
sending pin assignment data for assigning said plurality of logical pin numbers to a pin assignment converter;
converting said plurality of logical pin numbers into said plurality of physical pin numbers;
generating said test signal based upon said generation data;
feeding said test signal to said semiconductor device pursuant to said plutality of physical pin numbers; and
measuring a signal output from said semiconductor device in response to said test signal,
wherein said converting includes:
inputting said pin designating bit into a pin map memory which is provided in said converter and stores said pin assignment data;
outputting output data according to said pin assignment data stored in said pin map memory; and
selecting either said output data from said pin map memory or said pin designating bit from said tester controller as said physical pin number.

9. A semiconductor device testing system for testing a semiconductor device with a plurality of pins by applying a test signal, comprising:
a tester controller to output generation data for generating said test signal, a pin designating bit which designates a logical pin number of a pin to which said test signal is applied, and pin assignment data denoting a relationship between said logical pin number and a physical pin number of said semiconductor device to which said test signal is applied;
a pin assignment converter to receive said logical pin number and to convert said logical pin number into said physical pin number based on said pin assignment data; and
a test unit to prepare said test signal according to said generation data for application to a physical pin designated by said physical pin number,
wherein said pin assignment converter includes:
a pin map memory which stores said pin assignment data, having address terminals for inputting said pin designating bit, and data terminals for outputting output data; and
a multiplexer which receives said output data from said pin map memory and said pin designated bit from said tester controller, and outputs either said output data or said pin designating bit as said physical pin number;
wherein said tester controller notifies said pin assignment convertor of said logical pin number;
wherein said tester controller outputs to said pin assignment converter a recognition bit used for determining whether or not said logical pin number and said physical pin number are converted;
a pin number converting apparatus that converts a plurality of logical pin numbers into a plurality of physical pin numbers, said plurality of physical pin numbers being assigned to respective of said plurality of logical pin numbers, comprising:
a controller to output a pin designating bit which designates said logical pin number, and a recognition bit; and
a pin assignment converter including:
a pin map memory, which stores said pin assignment data, having address terminals for inputting said pin designating bit, and data terminals for outputting output data; and
a multiplexer which receives said output data from said pin map memory and said pin designated bit from said controller, and outputs either said output data or said pin designating bit as said physical pin number according to said recognition bit.

10. A semiconductor device testing system that tests a semiconductor device including a semiconductor chip and a semiconductor package having a plurality of pins by applying a test signal thereto, comprising:
a preparing circuit to prepare data for generating said test signal, a pin designating bit that designates a logical pin number of a pin to which said test signal is applied according to said data, and a recognition bit used for determining whether or not said logical pin number is converted;
a generating circuit to generate said test signal based upon said data;
a converting circuit to convert said logical pin number into a physical pin number of said plurality of pins; and
an applying circuit to apply said test signal to a pin designated by said physical pin number,
wherein said converting circuit includes:

a storing circuit to store a table denoting a relationship between said logical pin number and said physical pin number to which said test signal is applied, having address terminals for inputting said pin designating bit and data terminals for outputting output data; and a selecting circuit which receives said output data from said storing circuit and said pin designating bit from said preparing circuit, and outputs either said output data or said pin designating bit as said physical pin number;

wherein said preparing circuit prepares a recognition signal denoting whether or not said logical pin number is converted into said physical pin number, wherein said converting circuit converts pursuant to said recognition signal.

11. A semiconductor device testing system as set forth in claim 10, wherein said data differs among different semiconductor chips.

12. A semiconductor device testing system as set forth in claim 10, wherein said logical pin number differs among different semiconductor chips.

13. A semiconductor device testing system as set forth in claim 10, wherein said physical pin number differs among different semiconductor packages.

* * * * *